(12) United States Patent
Park et al.

(10) Patent No.: US 8,411,501 B2
(45) Date of Patent: *Apr. 2, 2013

(54) PROGRAMMING METHOD FOR NON-VOLATILE MEMORY DEVICE

(75) Inventors: Ki-tae Park, Seongnam-si (KR); Yeong-taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/372,525

(22) Filed: Feb. 14, 2012

(65) Prior Publication Data

US 2012/0140557 A1    Jun. 7, 2012

Related U.S. Application Data

(63) Continuation of application No. 12/264,343, filed on Nov. 4, 2008, now Pat. No. 8,116,131.

(30) Foreign Application Priority Data

Feb. 26, 2008    (KR) .................. 10-2008-0017409

(51) Int. Cl.
   *G11C 11/34*    (2006.01)
(52) U.S. Cl. .......... 365/185.02; 365/185.03; 365/185.19
(58) Field of Classification Search ............. 365/185.03, 365/185.19, 185.22, 185.28, 185.18, 185.24, 365/189.07, 196, 185.02
See application file for complete search history.

(56) References Cited

U.S. PATENT DOCUMENTS

| | | | |
|---|---|---|---|
| 5,949,714 A | 9/1999 | Hemink et al. | |
| 6,243,290 B1 | 6/2001 | Kurata et al. | |
| 6,259,624 B1 | 7/2001 | Nobukata | |
| 7,177,199 B2 | 2/2007 | Chen et al. | |
| 7,471,565 B2 | 12/2008 | Aritome | |
| 7,570,520 B2 | 8/2009 | Kamei et al. | |
| 7,796,430 B2 * | 9/2010 | Lutze et al. | 365/185.03 |
| 7,869,273 B2 | 1/2011 | Lee et al. | |
| 8,116,131 B2 * | 2/2012 | Park et al. | 365/185.03 |
| 2005/0024938 A1 | 2/2005 | One et al. | |
| 2006/0104114 A1 | 5/2006 | Toda | |
| 2006/0126396 A1 | 6/2006 | Shappir et al. | |
| 2006/0245262 A1 | 11/2006 | Li | |
| 2006/0285392 A1 | 12/2006 | Incarnati et al. | |

(Continued)

FOREIGN PATENT DOCUMENTS

| | | |
|---|---|---|
| JP | 1998003792 | 1/1998 |
| JP | 2000149578 | 5/2000 |

(Continued)

OTHER PUBLICATIONS

First Office Action From Chinese Patent Office Dated Dec. 6, 2012.

(Continued)

*Primary Examiner* — Dang Nguyen
(74) *Attorney, Agent, or Firm* — Volentine & Whitt, PLLC

(57) ABSTRACT

Provided is a method of programming a non-volatile memory device. The method includes applying a first programming pulse to a corresponding wordline of the non-volatile memory device, applying a second programming pulse to the wordline, wherein a voltage of the second programming pulse is different from that of the first programming pulse, and applying voltages to each bitline connected to the wordline, the voltages applied to each of the bitlines are different from each other according to a plurality of bit values to be programmed to corresponding memory cells in response to the first programming pulse or the second programming pulse.

15 Claims, 22 Drawing Sheets

U.S. PATENT DOCUMENTS

2006/0291291 A1 12/2006 Hosono et al.
2007/0115726 A1* 5/2007 Cohen et al. ............ 365/185.19
2008/0055998 A1 3/2008 Jung et al.

FOREIGN PATENT DOCUMENTS

| JP | 2003196988 | 7/2003 |
| JP | 2005149593 | 6/2005 |
| JP | 2005174414 | 6/2005 |
| JP | 2006179167 | 7/2006 |
| JP | 2007004861 | 1/2007 |
| JP | 2009545093 | 12/2009 |
| KR | 1020060134824 A | 12/2006 |

OTHER PUBLICATIONS

Japanese Patent Office Action Dated Feb. 13, 2013.

* cited by examiner

FIG. 17

| State | Cell Vth | LSB | MSB | LAT Latch State | BL Voltage |
|---|---|---|---|---|---|
| 01 | $Vth < V_{vrf-1}$ | 1 | 0 | 00 | 0 |
| | $V_{vrf-1} < Vth < V_{vrf-2}$ | | | 01 | V1 |
| | $V_{vrf-2} < Vth < V_{vrf-3}$ | | | 10 | V2 |
| | $V_{vrf-3} < Vth < V_{vf01}$ | | | 11 | V3 |
| | $Vth > V_{vf01}$ | | | – | Vdd |
| 00 | $Vth < V_{vrf-1}$ | 0 | 0 | 00 | 0 |
| | $V_{vrf-1} < Vth < V_{vrf-2}$ | | | 10 | V2 |
| | $V_{vrf-2} < Vth < V_{vrf00}$ | | | 11 | V3 |
| | $Vth > V_{vf00}$ | | | – | |
| 10 | $Vth < V_{vrf-1}$ | 0 | 1 | 00 | 0 |
| | $V_{vrf-1} < Vth < V_{vrf10}$ | | | 11 | V3 |
| | $Vth > V_{vrf10}$ | | | – | Vdd |

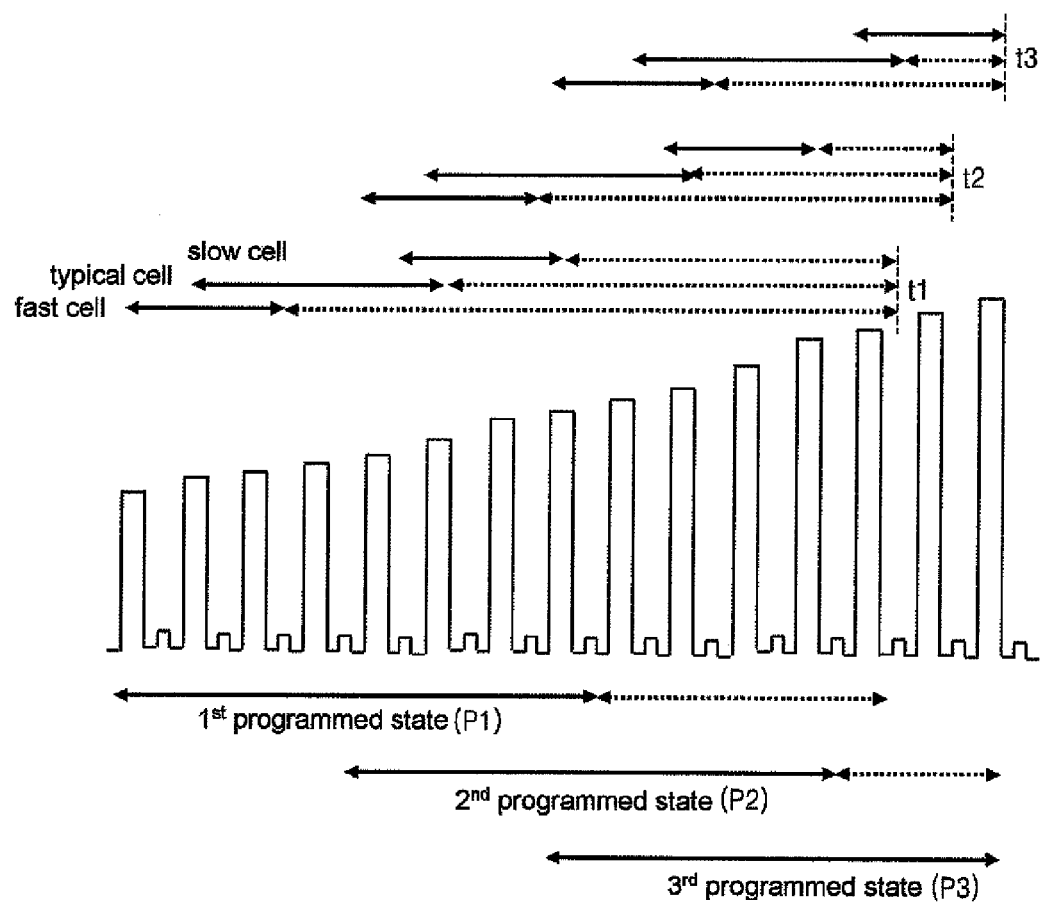

PROGRAMMING METHOD FOR NON-VOLATILE MEMORY DEVICE

CROSS-REFERENCE TO RELATED PATENT APPLICATION

This application is a Continuation application of application Ser. No. 12/264,353, filed Nov. 4, 2008 which claims the benefit of Korean Patent Application No. 10-2008-0017409 filed on Feb. 26, 2008, the subject matter of which is hereby incorporated entirety by reference.

BACKGROUND

The present invention relates to a method of programming a non-volatile memory device. More particularly, the invention relates to a method of programming a non-volatile memory device which requires less time for programming and is capable of reducing coupling effect due to a programming sequence and/or cell distribution.

Non-volatile memory devices are electrically programmable and erasable and are able to retain stored data when supplied power is interrupted. Flash memory is one type of non-volatile memory and uses an electrical charge to store data. Each of the memory cells forming a flash memory device includes a control gate, a charge storage layer, and a cell transistor having a source and a drain. The flash memory device changes the data value stored by a memory cell by controlling the quantity of charge accumulated on the charge storage layer of the memory cell.

The cell transistor of the flash memory device controls the quantity of charge stored on the charge storage layer using the so-called F-N tunneling phenomenon. An erase operation may be performed in relation to a cell transistor by applying a ground voltage to the control gate and by applying a voltage higher than a constituent power supply voltage to the semiconductor substrate (or bulk). Under these erase bias conditions, a strong electric field is formed between the charge storage layer and the semiconductor bulk due to a large difference in the electrical resistances of same. As a result, charge accumulated on the charge storage layer is discharged by F-N tunneling, and the critical voltage of the erased cell transistor decreases.

A programming operation may be performed in relation to the cell transistor by applying a voltage higher than the power supply voltage to the control gate and applying a ground voltage to the drain, as well as the semiconductor bulk. Under these programming bias conditions, charge accumulates on the charge storage layer due to F-N tunneling, and the critical voltage of the cell transistor increases.

Hence, a memory cell state in which charge is relatively absent from the charge storage layer and the corresponding critical voltage of the cell transistor is negative is conventionally referred to as an erased state. Further, a memory cell state in which charge accumulates on the charge storage layer and the corresponding critical voltage of the cell transistor is greater than zero is referred to as a programmed state.

SUMMARY

Embodiments of the invention provide a programming method for a non-volatile device which is capable of reducing coupling effects commonly associated with a programming sequence and/or cell distribution.

In one embodiment, the invention provides a programming method for a multi-level cell non-volatile memory device. The method includes; applying a first programming pulse to a wordline of the non-volatile memory device, applying a second programming pulse to the wordline, wherein a voltage level of the second programming pulse is different from that of the first programming pulse, and applying bitline voltages to respective bitlines associated with the wordline, wherein the bitline voltages vary in accordance with a plurality of data bit values to be programmed to a plurality of memory cells associated with the word line and bitlines and in response to either the first programming pulse or the second programming pulse.

In another embodiment, the invention provides a method of programming a non-volatile memory device, the method comprising; performing a programming operation during which at least one programming pulse that varies in relation to a plurality of $1^{st}$ through $M^{th}$ data bit values to be programmed to a plurality of memory cells connected to a wordline is applied to the wordline, and thereafter performing a verifying operation, wherein execution timing of the verifying operation varies in relation to the plurality $1^{st}$ through $M^{th}$ data bit values.

In another embodiment, the invention provides a method of programming a non-volatile memory device, the method comprising; applying first through $N^{th}$, where is a natural integer greater than 1, programming pulses to a word line, wherein respective voltage levels for the first through $N^{th}$ programming pulses are different, and applying bitline voltages to respective bitlines associated with the wordline, wherein the bitline voltages vary in accordance with a plurality of data bit values to be programmed to a plurality of memory cells associated with the word line and bitlines and in response to either the first programming pulse or the second programming pulse.

BRIEF DESCRIPTION OF THE DRAWINGS

FIG. 17 is a data table version of voltage diagram shown in FIG. 16; and

FIG. 18 shows programmed states for a non-volatile memory device programmed according method embodiments of the invention.

DESCRIPTION OF EMBODIMENTS

Several embodiments of the invention will now be described with reference to the attached drawings. The invention may, however, be variously embodied and should not be construed as being limited to only the illustrated embodiments. Rather, the embodiments are presented as examples teaching the making and use of the invention. Throughout the drawings and written description, like reference indicators are used to denote like or similar elements.

Figure 1A:
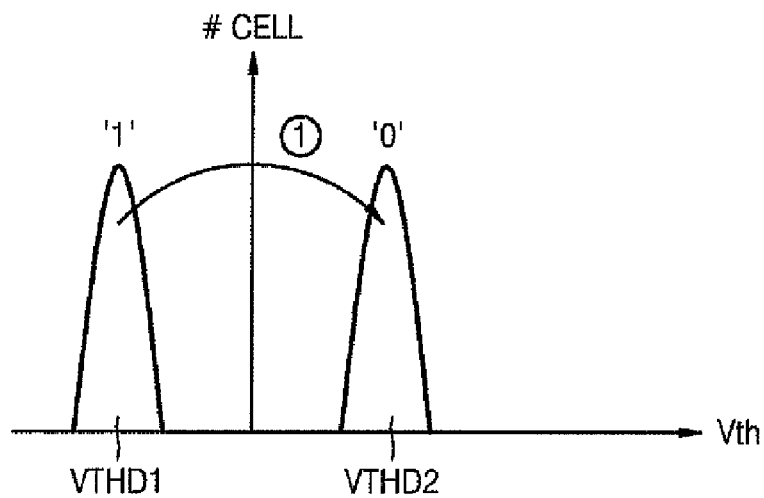
FIG. 1A is a diagram showing an example of programming one bit of data to a non-volatile memory device using two voltage distributions.

FIG. 1A is a diagram showing an example of programming one bit of data to a non-volatile memory cell using two voltage distributions. When the data bit value to be programmed is '0', the critical voltage of a non-volatile memory cell is changed to be greater than 0V. That is, the critical voltage of the non-volatile memory cell is placed in a second voltage distribution (VTHD2). In contrast, when the data bit value to be programmed is '1', the critical voltage of the non-volatile memory cell remains unchanged and less than 0V. This assumes that the non-volatile memory cell is initially in an erased state, or that the critical voltage of the non-volatile memory cell is in a first voltage distribution (VTHD1).

Figure 1B:
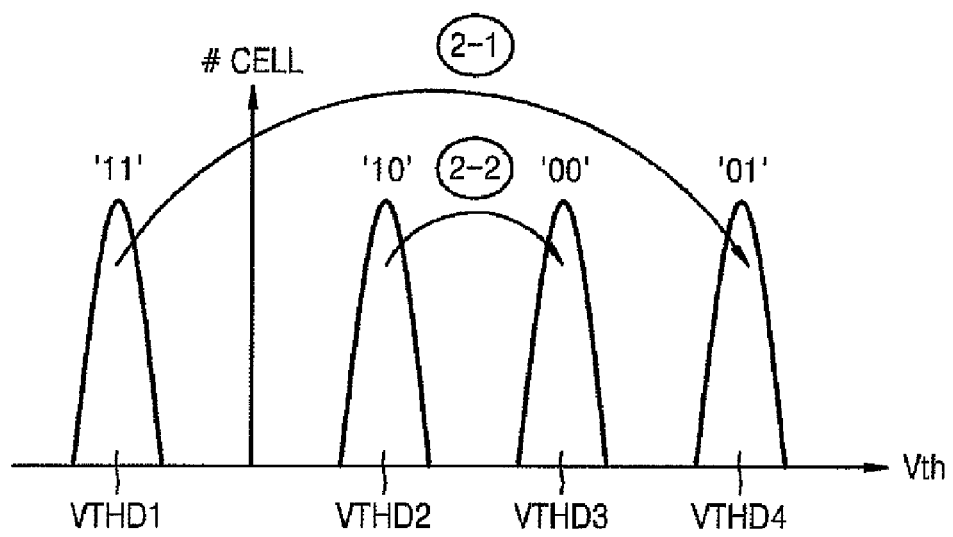
FIG. 1B is a diagram showing an example of programming two bits of data to the non-volatile memory device of FIG. 1A.
Figure 1C:
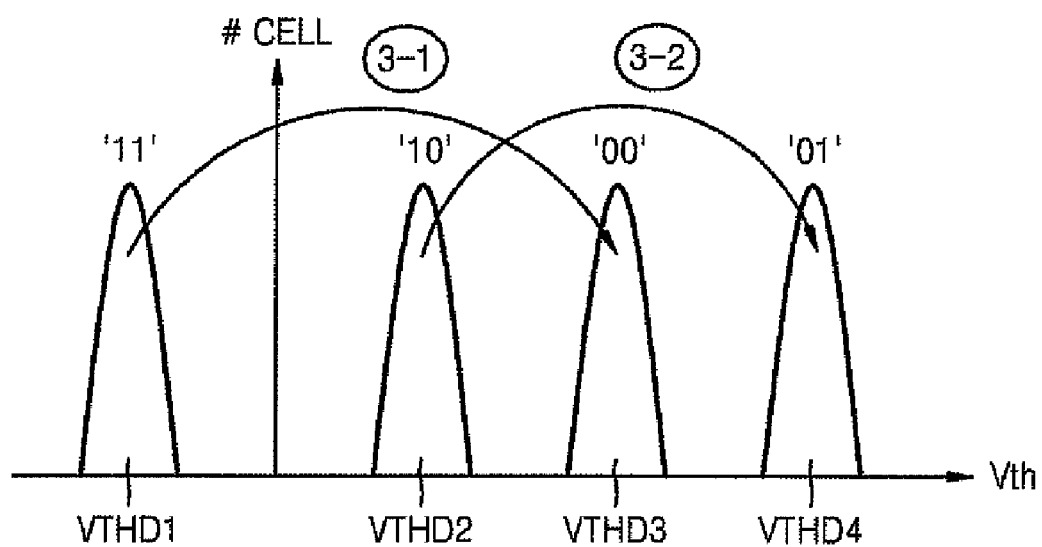
FIG. 1C is a diagram showing another example of programming two bits of data to the non-volatile memory cell using four voltage distributions.

FIG. 1B is a diagram showing an example of programming two bits of data to the non-volatile memory cell using four voltage distributions. After a first bit of data (e.g., a least significant bit, LSB, of data) has been programmed to the two-bit memory cell using the process described in relation to FIG. 1A, a second bit of data (e.g., a most significant bit, MSB, of data) must be programmed. Thus, where the value of the first data bit is '0', the non-volatile memory cell will initially be placed in the second voltage distribution (VTHD2). Subsequently, where the value of a second bit of data to be programmed is also '0', the critical voltage of the non-volatile memory cell is changed to the third voltage distribution (VTHD3). (See, operation 2-2 in FIG. 1B). However, where the second bit of data to be programmed in '1', the critical voltage of the non-volatile memory cell remains in the second voltage threshold distribution (VTHD2).

In similar manner, where the value of the first data bit is '1', the non-volatile memory cell initially remains in the first voltage distribution (VTHD1), assuming an initially erased state. Subsequently, where the value of a second bit of data to be programmed is also '0', the critical voltage of the non-volatile memory cell is changed to the fourth voltage distribution (VTHD4). (See, operation 2-1 in FIG. 1B). However, where the second bit of data to be programmed in '1', the critical voltage of the non-volatile memory cell remains in the first voltage threshold distribution (VTHD1).

Figure 10:
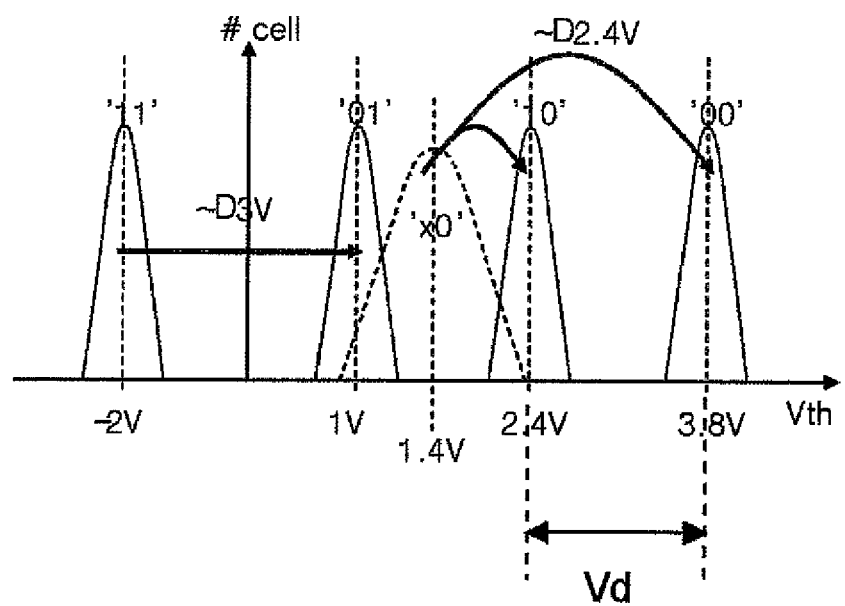
FIG. 10 is a diagram further illustrating the term "Vd" used in the embodiment of FIG. 9.

FIG. 10 is a diagram showing another example of programming two bits of data to the non-volatile memory cell using four voltage distributions.

In the example shown in FIG. 1B, the critical voltage of the non-volatile memory cell potentially changes between the first voltage distribution and the fourth voltage distribution or between the second voltage distribution and the third voltage distribution as when the second bit of data is programmed. In contrast, in the example shown in FIG. 10, the critical voltage of the non-volatile memory cell potentially changes between the first voltage distribution and the third voltage distribution (see, operation 3-1) or between the second voltage distribution and the fourth voltage distribution (see, operation 3-2) when the second bit of data is programmed.

Figure 2A:
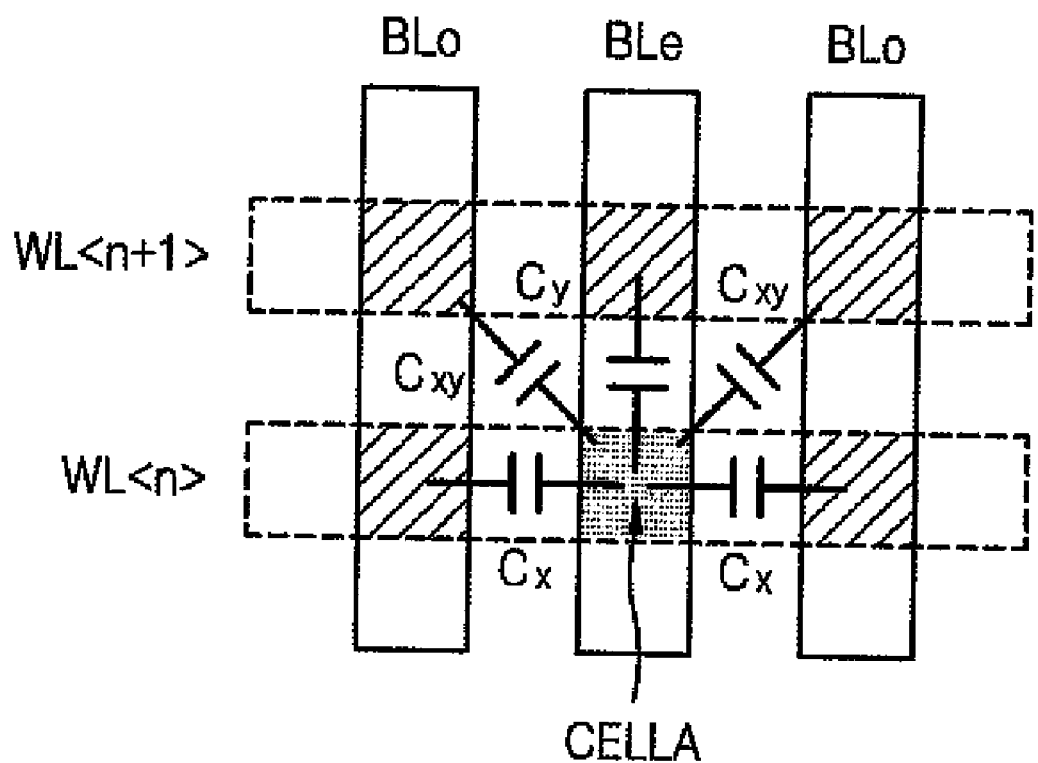
FIG. 2A is a diagram showing an example of programming one bit of data using two voltage distributions.

FIG. 2A shows a memory cell CELLA to be programmed in relation to surrounding memory cells in an array of memory cells of a non-volatile memory device defined by intersecting word lines (WL) and bit lines (BL). It is assumed that the memory cell CELLA is initially programmed to have a critical voltage in the first voltage distribution (VTHD1), but may be programmed to have a critical voltage in any one of the second voltage distribution (VTHD2), third voltage distribution (VTHD3), or fourth voltage distribution (VTHD4).

Figure 2B:
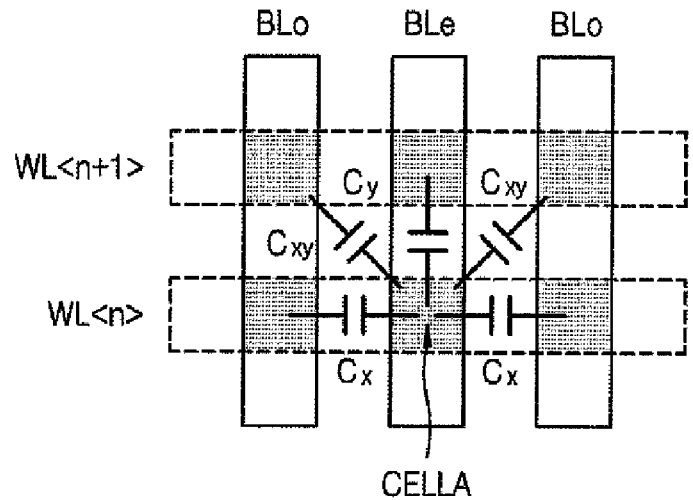
FIG. 2B is a diagram showing an example of programming two bits of data using four voltage distributions.
Figure 2B:
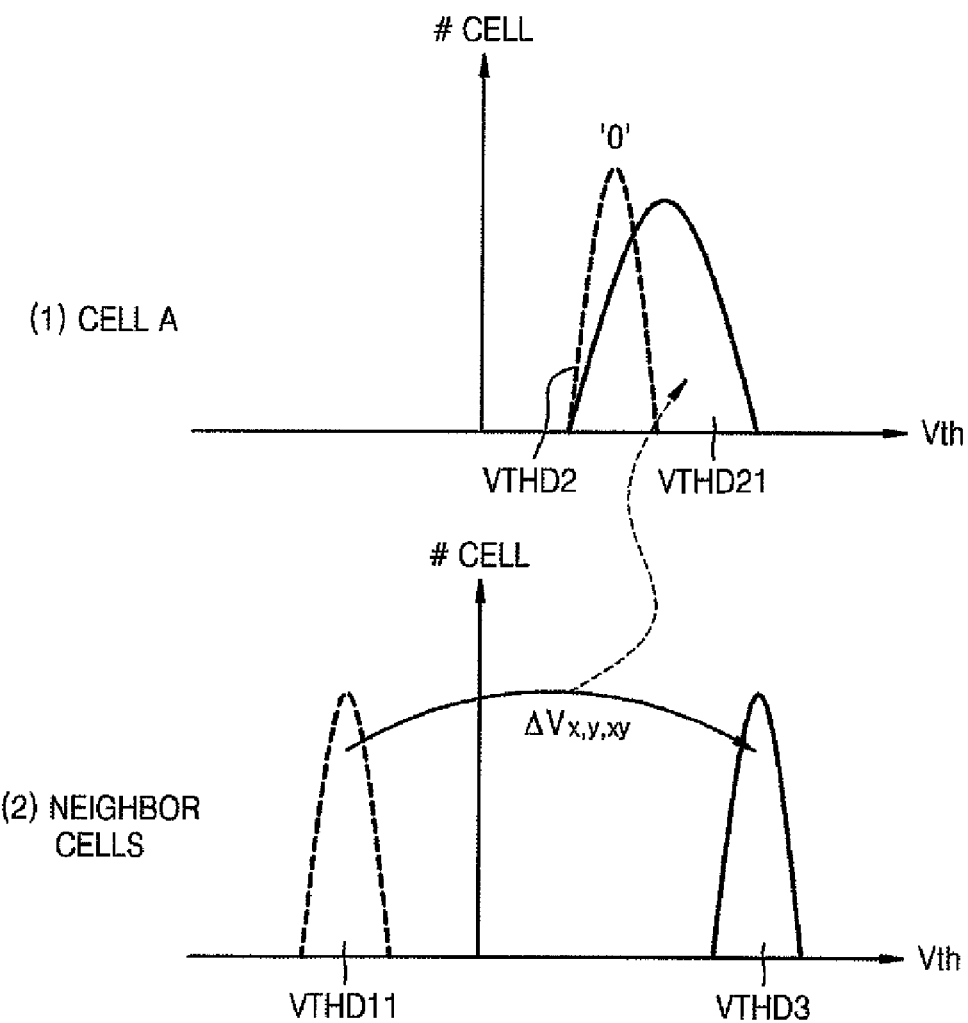
Figure 2C:
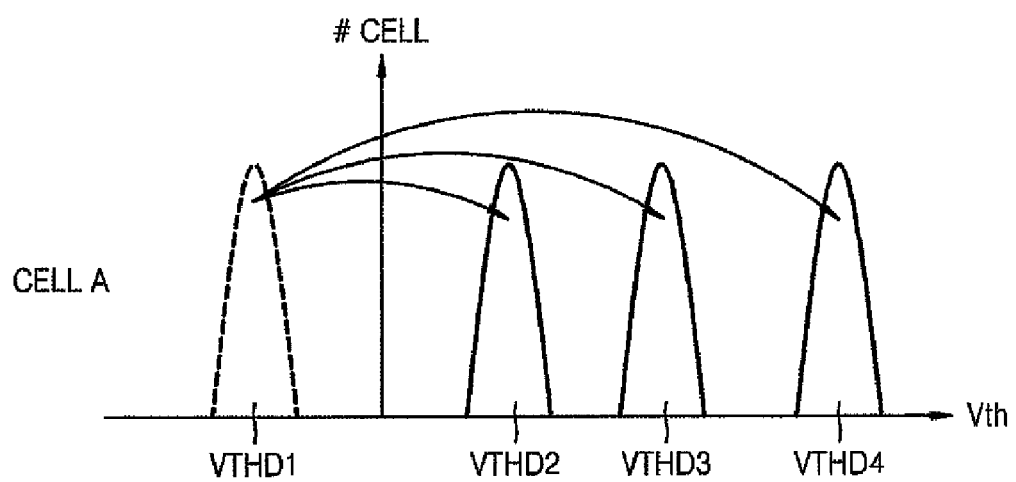
FIG. 2C is a diagram showing another example of programming two bits of data using four voltage distributions.

FIG. 2B further shows that a voltage distribution for the programmed memory cell CELLA may be shifted due to capacitive coupling (e.g., one or more of Cx, Cy, and Cxy) between adjacent wordlines and/or bitlines when neighbouring memory cells are programmed after memory cell CELLA has been programmed. Under these conditions the critical voltage of memory cell CELLA, which is intended to be within the second voltage distribution (VTHD2) may be undesirably altered (e.g., broadened beyond the defined range of the second voltage distribution VTHD2). Although FIG. 2B specifically shows a case wherein the critical voltage of memory cell CELLA is intended to be in the second voltage distribution (VTHD2), the voltage distribution broadening caused by capacitive coupling may occur when the critical voltage for memory cell CELLA is intended to be in the first voltage distribution (VTHD1), the third voltage distribution (VTHD3), or the fourth voltage distribution (VTHD4). In any one of these cases, a voltage distribution for the programmed memory cell CELLA may become shifted. Similarly, although FIG. 2B shows an example of voltage distribution shifting for memory cell CELLA under the influence of neighbouring cell programming from a first voltage distribution (VTHD11) to a third critical voltage distribution (VTHD3), such voltage distribution shifting may occur in relation to other programming operations applied to one or more of the neighbouring cells.

Figure 3A:
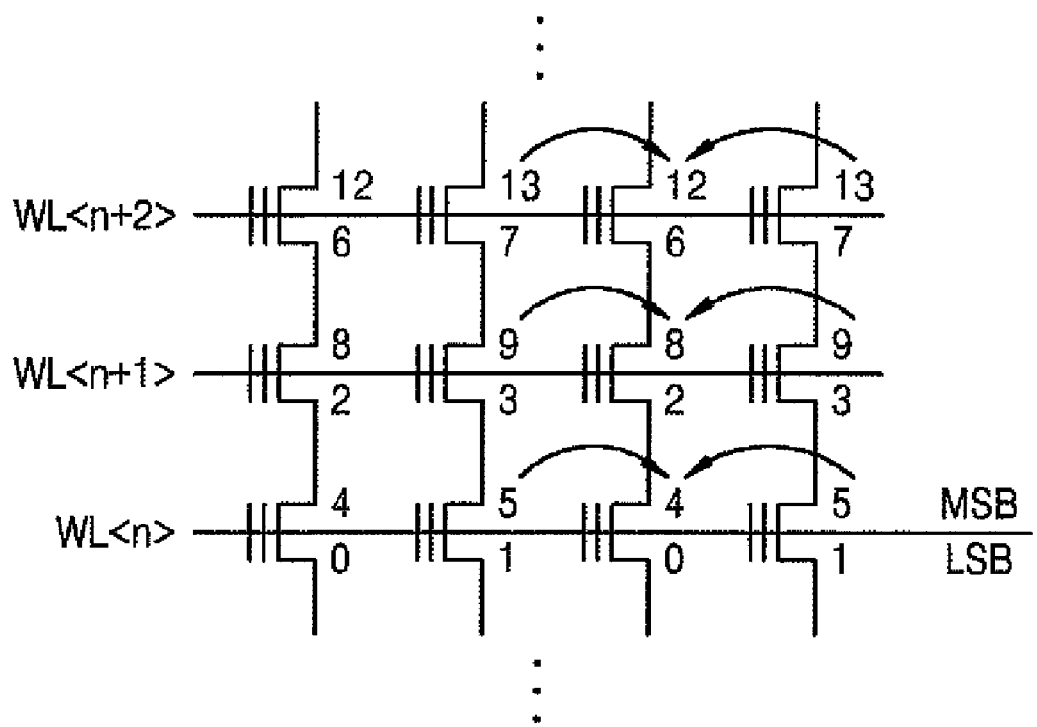
FIGS. 3A and 3B are diagrams showing that voltage distributions of memory cells already programmed are shifted due to capacitive couplings between adjacent wordlines or adjacent bitlines.

FIG. 3A is a circuit diagram showing a portion of a memory cell array in a non-volatile memory device in which memory cells connected to odd bitlines and memory cells connected to even bitlines are programmed separately. That is, memory cells connected to a first bitline and a third bitline and memory cells connected to a second bitline and a fourth bitline are programmed separately. Numbers 1 through 13 shown in FIG. 3A indicate an exemplary programming sequence. When the memory cells connected to odd bitlines are programmed after the memory cells connected to even bitlines are programmed, a programming voltage for programming the memory cells connected to the odd bitlines may change critical voltages of the memory cells connected to the even bitlines due to capacitive couplings between bitlines.

Figure 3B:
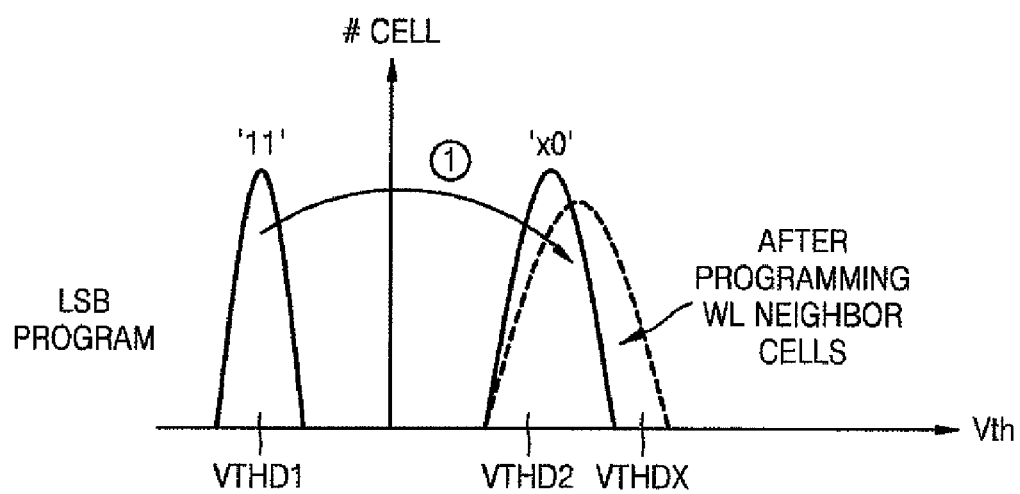
Figure 3B:
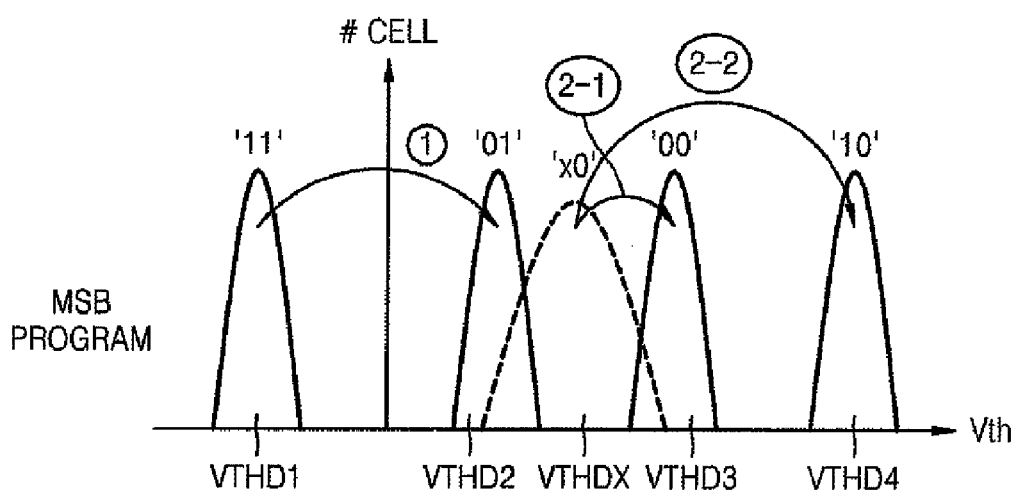

For example, the upper diagram shown in FIG. 3B (related to a LSB programming step) shows a voltage distribution for memory cells connected to the even bitlines being shifted from a defined second voltage distribution (VTHD2) to an errant voltage distribution (VTHDX) due to the programming of the memory cells connected to the odd bitlines which occurs after the first bit of data has been programmed to the memory cells connected to the even bitlines. The lower diagram shown in FIG. 3B (related to the MSB programming step) shows the possible ill-effects of subsequent voltage distribution transitions from or to the errant voltage distribution (VTHDX).

FIGS. 4A through 5B are respective circuit diagrams showing non-volatile memory devices in which memory cells connected to bitlines adjacent to each other are programmed simultaneously.

The non-volatile memory devices shown in FIGS. 4A through 5B are able to prevent undesired changes in voltage distributions due to capacitive couplings Cx, Cy, and Cxy by programming memory cells connected to the adjacent bitlines simultaneously. Thus, partial memory cell array shown in FIG. 4A includes memory cells connected to a single wordline that are programmed simultaneously. FIG. 4B is a circuit diagram further showing a portion of the memory cell array of FIG. 4A.

Figure 4A:
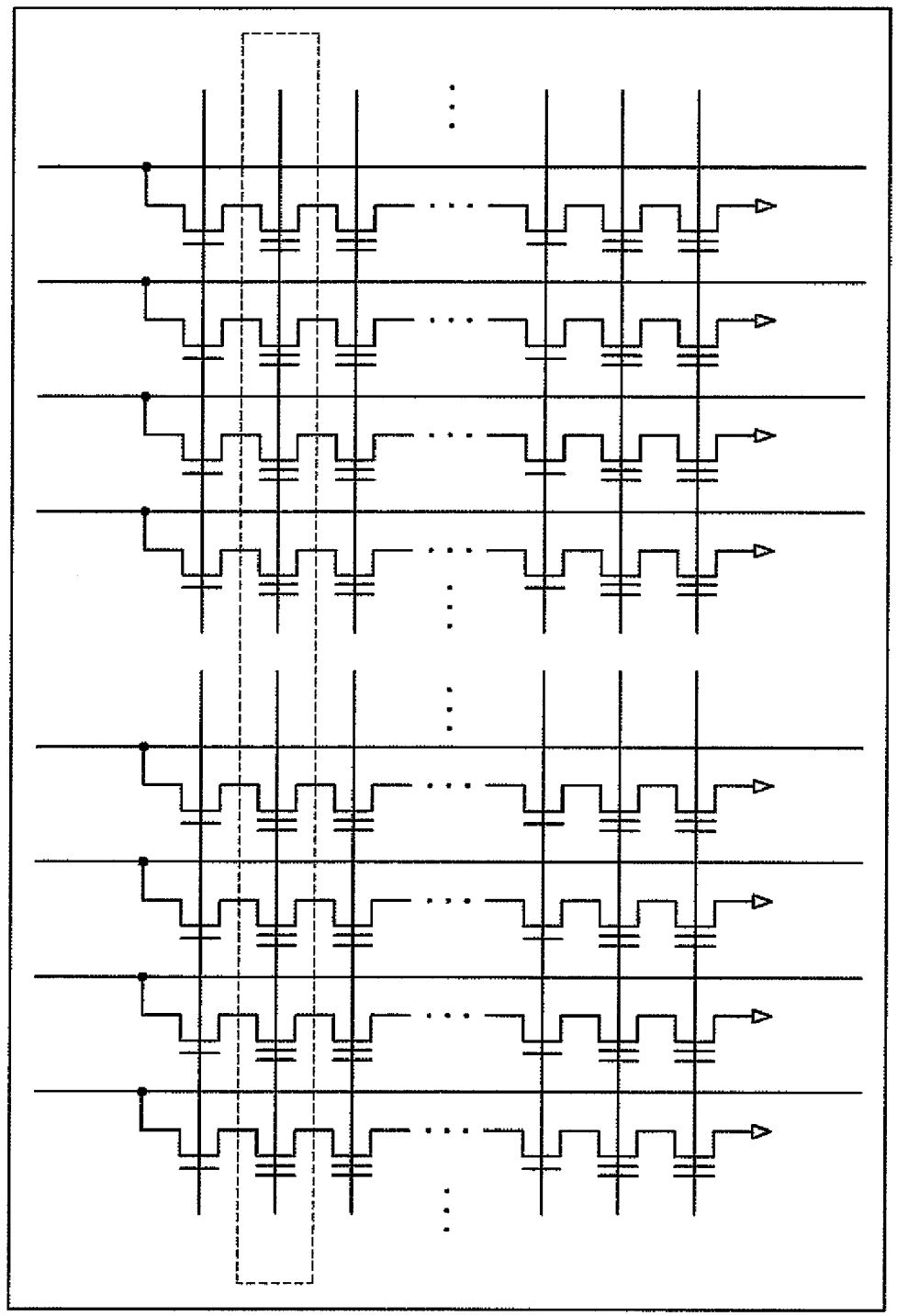
FIGS. 4A through 5B respectively are circuit diagrams showing non-volatile memory devices in which memory cells connected to bitlines adjacent to each other are simultaneously programmed.
Figure 4B:
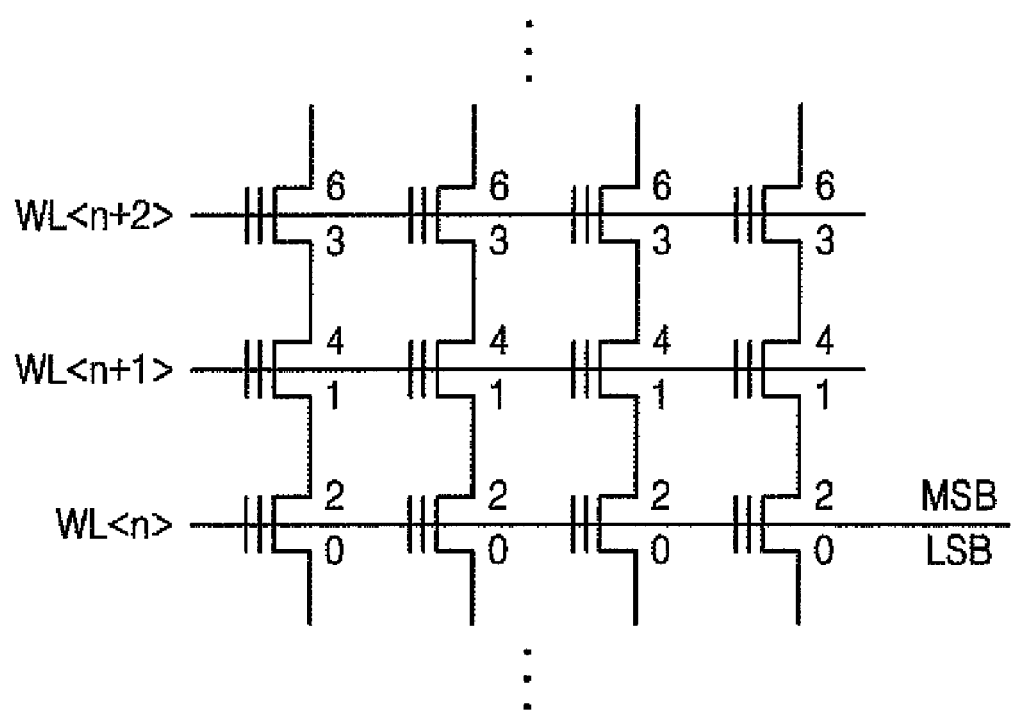

Number 0 through 6 shown in FIG. 4B indicate an exemplary programming sequence. Referring to these numbers, after a first plurality of memory cells (memory cells marked with number 0) connected to a first wordline (WL<n>) are programmed simultaneously, a second plurality of memory cells (memory cells marked with number 1) connected to a second wordline (WL<n+1>) are programmed simultaneously, etc.

Figure 5A:
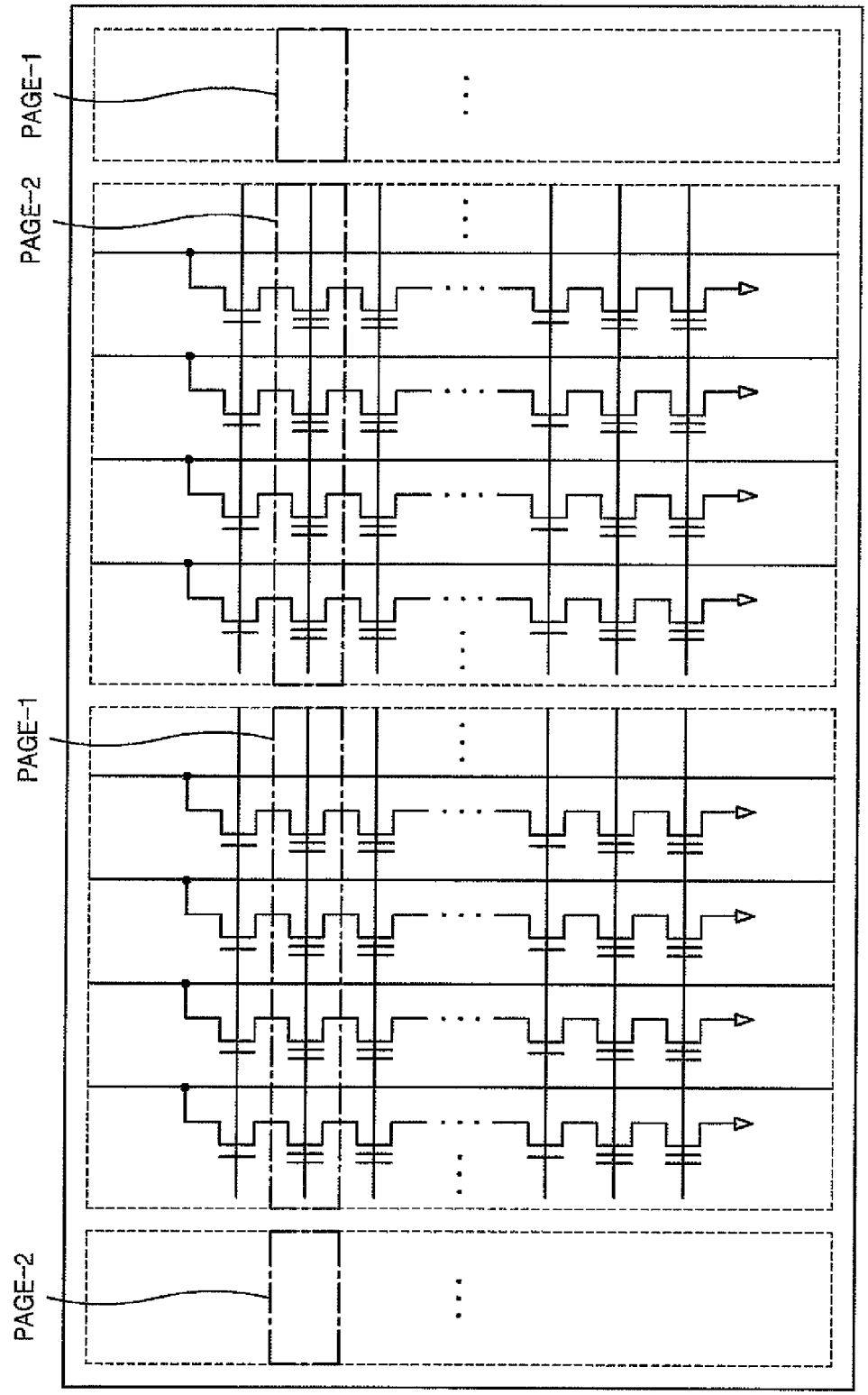
Figure 5B:
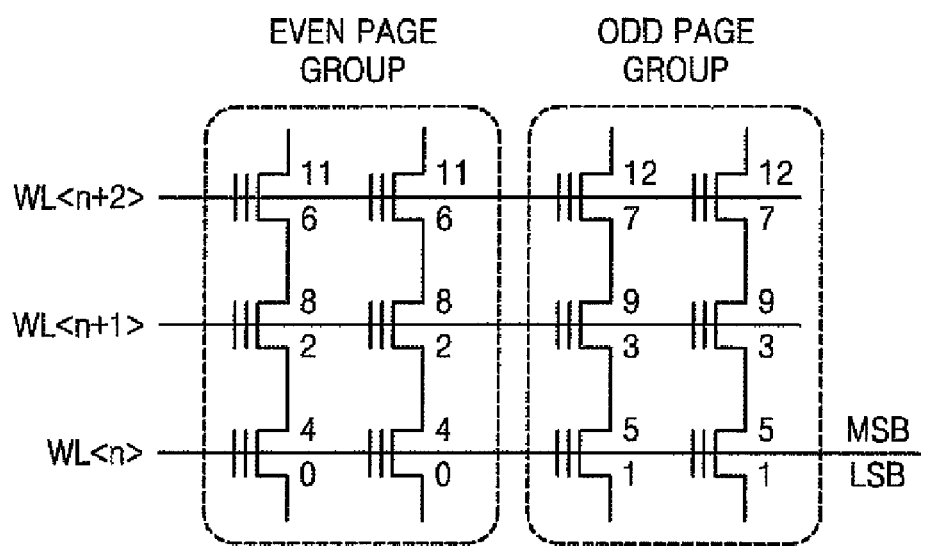

In the non-volatile memory device shown in FIG. 5A, the memory cells in a memory cell array are also programmed on a page basis (i.e., within a page group). FIG. 5B is a circuit diagram showing a portion of the memory cell array of FIG. 5A.

Numbers 0 through 12 shown in FIG. 5B indicate another exemplary programming sequence. Referring to the numbers, after a first plurality of memory cells (memory cells marked with number 0) included in even page groups and connected to a first wordline (WL<n>) are programmed, a second plurality of memory cells (memory cells marked with number 1) included in odd page groups and connected to the first wordline (WL<n>) are programmed, etc.

At this point in the programming operation described in relation to FIGS. 5A and 5B, if read current is simultaneously applied through adjacent bitlines to read data from the adjacent memory cells, sensing noise may occur due to capacitive coupling between adjacent bitlines. To prevent sensing noise, the bitlines are divided into odd bitlines (e.g., BLo1 and Blo2) and even bitlines (e.g., Bie1 and Ble2) and the read operation or verify operation may be performed separately for odd bitlines and even bitlines. However, capacitive coupling may still occur in the method due to the programming sequence and/or cell distribution of a non-volatile memory device as described in some additional details below.

Figure 6A:
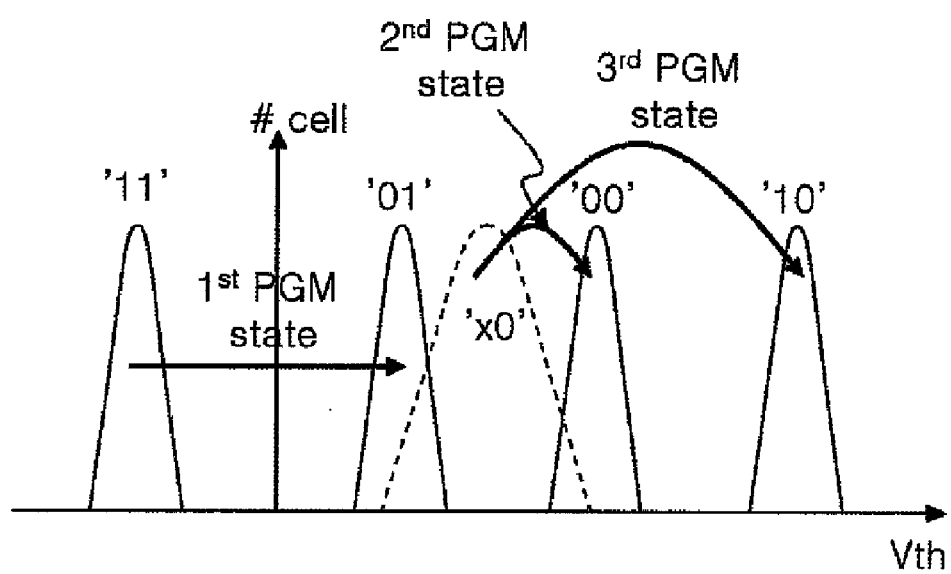
FIGS. 6A through 6C are diagrams showing a coupling effect due to a programming sequence for a non-volatile memory device.
Figure 6B:
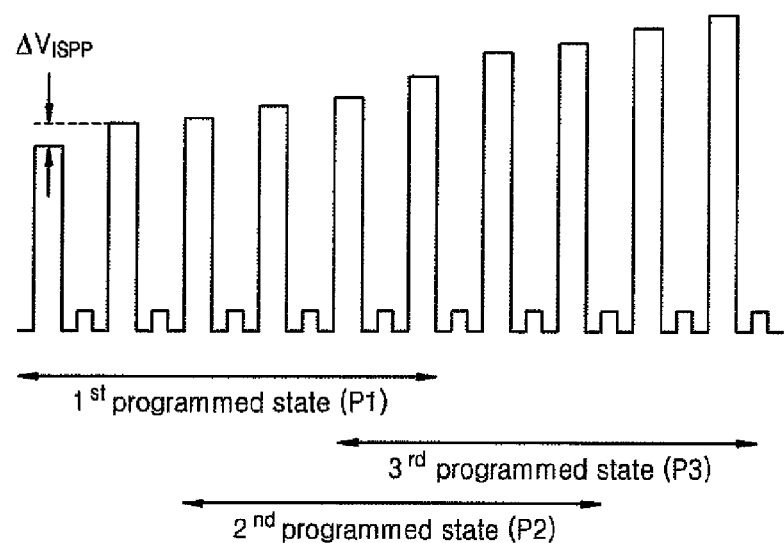
Figure 6C:
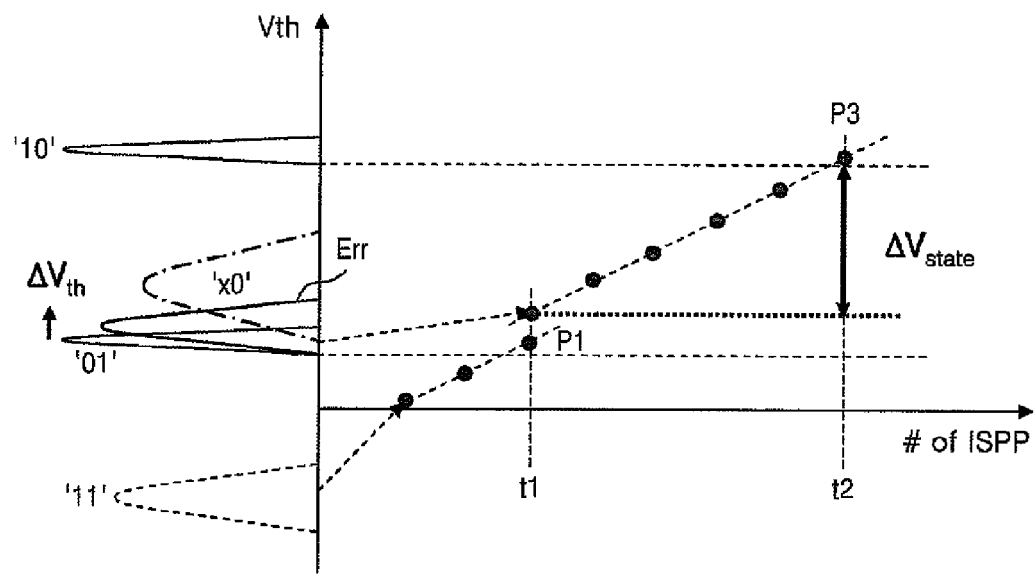

FIGS. 6A through 6C are diagrams further illustrating capacitive coupling effects that may arise due to a programming sequence for memory cells within a non-volatile memory device.

Referring to FIG. 6A, the non-volatile memory device is assumed to be a multi-level flash memory device having multi-bit memory cells (i.e., two-bit) capable of storing data bit values of: 11, 01, 00, and 10 in relation to corresponding voltage distributions. As explained in relation to FIG. 3B, a first voltage distribution associated with an initial erase state (i.e., data value 11) may transition to a second voltage distribution associated with the data value 01, and a reference critical voltage distribution 'x0' may then be shifted to the third voltage distribution associated with the data value 00 or the fourth voltage distribution associated with the data value 10.

At this point, as shown in FIG. 6B, a first programming operation P1 is performed in relation to a memory cell of the non-volatile memory device, such that the first voltage distribution 11 transitions to the second voltage distribution 01. Then, a second programming operation P2 is performed, such that the voltage distribution x0 is shifted to either the third critical voltage distribution 00, or a third programming operation P3 is performed, such that the voltage distribution x0 is shifted to the fourth voltage distribution 10. In other words, a programming sequence varies in accordance with the data value to be programmed.

As suggested by FIG. 6B, each one of the first through third programming operations may be implemented as an incremental step pulse programming (ISPP) operation applied to a corresponding wordline in the non-volatile memory device. However, as shown in FIG. 6C, when the third programming operation P3 is performed on an adjacent memory cell after the first programming operation P1 is performed, the second voltage distribution 01 may be shifted by a value ΔVth. Thus, the non-volatile memory cell has an errant voltage distribution (Err). In other words, although the first programming operation P1 is accomplished at a time t1 in the graph of FIG. 6C, the non-volatile memory cell may have a voltage distribution different from the expected voltage distribution due to a capacitive coupling effects because the third programming operation P3 is subsequently performed on adjacent memory cells at time t2.

Figure 7A:
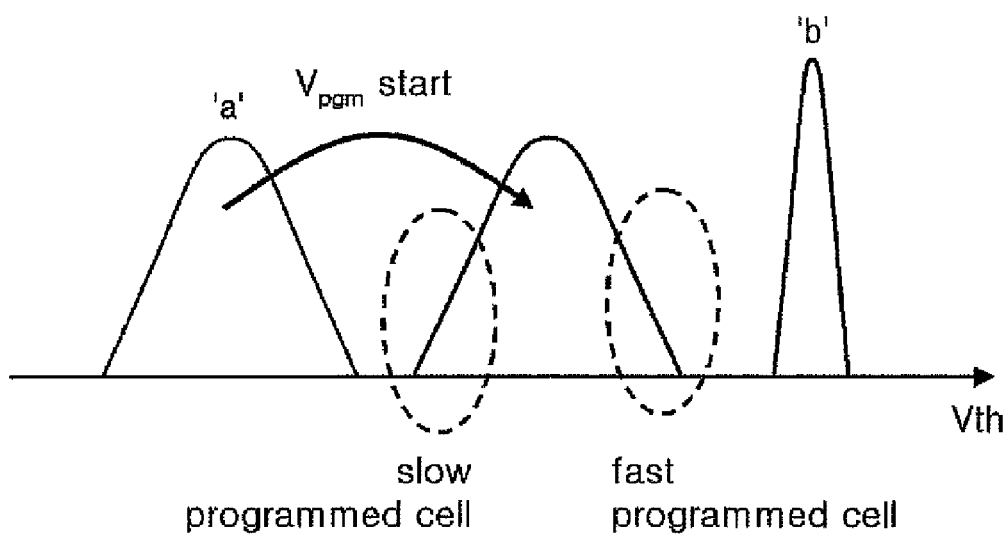
FIGS. 7A through 7C are diagrams showing a coupling effect due to a cell distribution in a non-volatile memory device.
Figure 7B:
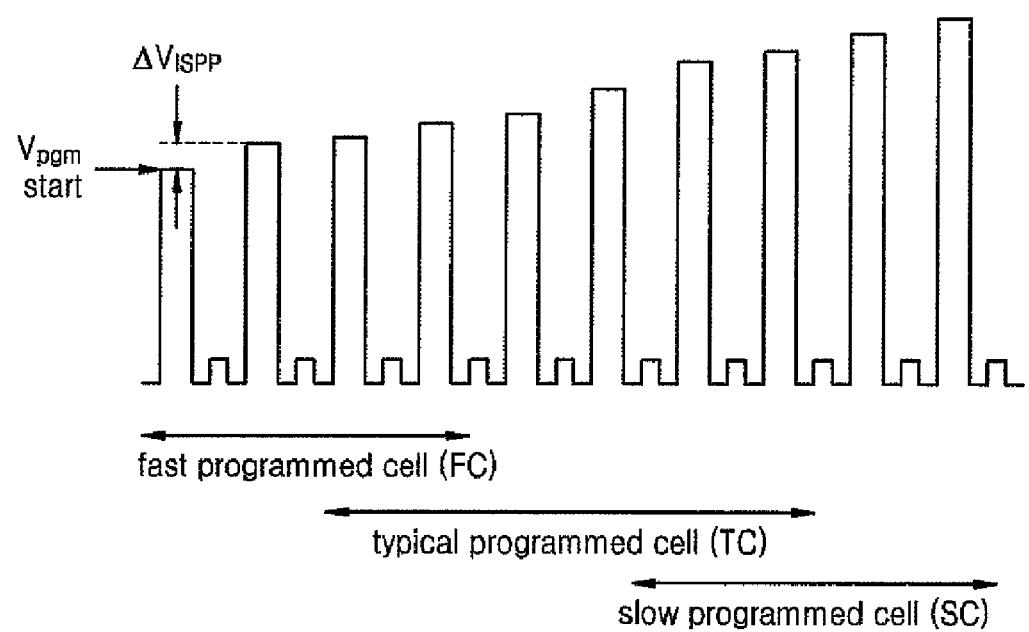
Figure 7C:
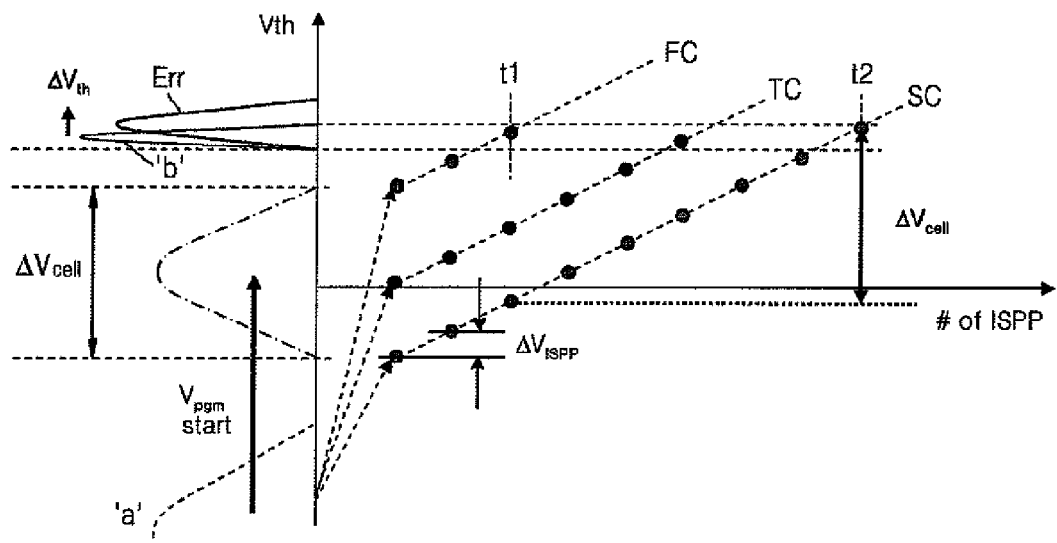

FIGS. 7A through 7C are diagrams further showing capacitive coupling effects due to cell distribution in a non-volatile memory device. Referring to FIG. 7A, a non-volatile memory device may form a voltage distribution 'b' by shifting a voltage distribution 'a', as suggested by the non-volatile memory device described in relation to FIG. 6A. At this point, memory cells may either be fast programmed or slow programmed according to the cell distribution of the non-volatile memory device. Therefore, when memory cells having the voltage distribution 'a' are programmed to have the voltage distribution 'b', programming time—which is the time required to obtain the desired threshold voltage corresponding to an intended data state—will vary according to the programming characteristics of the memory cells, as shown in FIG. 7B.

This difference in programming time causes a problem, as shown in FIG. 7C. Although fast memory cells (FC) are completely programmed by time t1, slow memory cells (SC) require additional time to be completely programmed when the voltage distribution 'a' is being shifted to the voltage distribution 'b'. Since programming voltages are continuously applied to the fast memory cells (FC) until time t2—which is the point in time when the slow memory cells (SC) are completely programmed—a coupling effect ΔVcell may occur. Thus, the critical voltage distribution 'b' may be shifted by ΔVth so that the memory cells may have an errant voltage distribution (Err).

Hereinafter, methods of programming a non-volatile memory device according to certain embodiments of the invention will be described. These embodiments provide methods that prevent capacitive coupling effects due to programming sequence and/or cell distribution.

Figure 8:
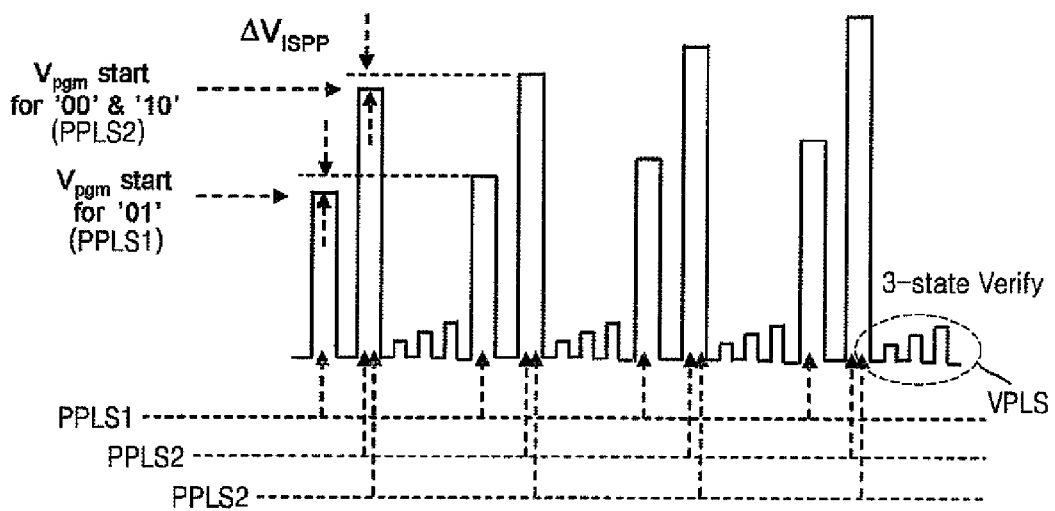
FIG. 8 is a diagram showing a method of programming a non-volatile memory device that prevents the coupling effect due to a programming sequence according to an embodiment of the invention.

FIG. 8 is a diagram showing a method of programming a non-volatile memory device that is capable of preventing capacitive coupling effects due to a programming sequence according to an embodiment of the invention.

Referring to FIG. 8, the method of programming a non-volatile memory device applies a first programming pulse (PPLS1) to a corresponding wordline of the non-volatile memory device and applies a second programming pulse (PPLS2), which has a voltage level different from that of the first programming pulse (PPLS1), to the wordline.

In this case, the non-volatile memory device of FIG. 8 may be a multi-level cell flash memory device. For convenience of explanation, a description specifically regarding to a 2-bit multi-level cell flash memory device will be given hereinafter. A detailed description regarding to multi-level cell flash memory devices having three or more bits will be described thereafter. Also, the method may be applied to a single-level cell memory device.

Referring to FIG. 8, either the first programming pulse (PPLS1) or the second programming pulse (PPLS2) is a programming pulse corresponding to a plurality of bit values. For example, if the non-volatile memory device is a 2-bit multi-level cell flash memory device, the first programming pulse (PPLS1) may be a programming pulse corresponding to the second bit value 01 shown in FIG. 6A, and the second programming pulse (PPLS2) may be a programming pulse corresponding to the fourth and third bit values 10 and 00 shown in FIG. 6A.

In other words, the second programming operation P2 and the third programming operation P3, respectively corresponding to the fourth and third bit values 10 and 00, may be performed simultaneously by applying the second programming pulse (PPLS2) of FIG. 8. Accordingly, as shown in FIG. 9, a plurality of voltages applied to each of the bitlines may be different from each other according to the corresponding bit values for the second programming pulse (PPLS2), such so as to perform programming operations for a plurality of bit values simultaneously according to the illustrated embodiment.

Figure 9:
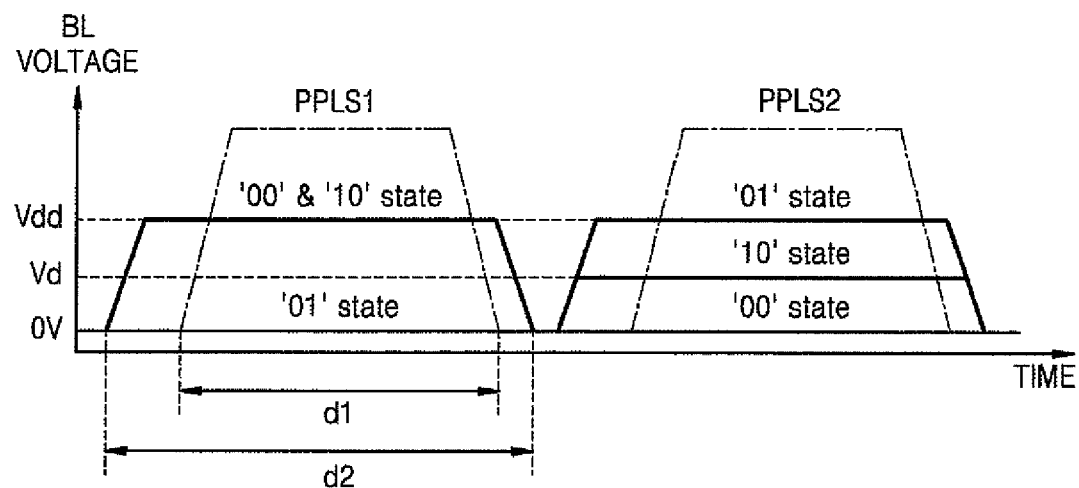
FIG. 9 is a graph of voltages applied to bitlines during the programming operation illustrated in FIG. 8.

FIG. 9 is a graph of voltages applied to bitlines during the programming operation of FIG. 8.

Referring collectively to FIGS. 8 and 9, the voltages that are different from each other according to bit values to be programmed to memory cells may be applied to each of the bitlines connected to wordlines to which a programming pulse regarding to a plurality of states is applied.

For example, like the embodiment shown in FIG. 8, when a programming operation associated with the fourth and third bit values 10 and 00 are performed simultaneously by the second programming pulse (PPLS2), bitline voltages for the fourth and third bit values 10 and 00 may be different from each other. Specifically, as shown in FIG. 9, when the bit value to be programmed to the memory cells is 00 and the bitline voltage is 0V, the bitline voltage when the bit value to be programmed to the memory cells is 10 may have a value Vd, wherein Vd is a voltage difference between a median value of a voltage distribution in the case where a bit value of 10 is to be programmed (e.g., a third data state) and a median value of a voltage distribution in the case where a bit value of 00 is to be programmed (e.g., a fourth data state).

As shown in FIG. 10, when the median value of the voltage distribution for the third data state is 2.4V, the median value of the voltage distribution for the fourth data state is programmed is 3.8V. Thus, the voltage difference Vd is 1.4V.

However, when the bit value to be programmed is 01, the bitlines do not receive the second programming pulse (PPLS2), and an inhibit voltage Vdd may be applied to the bitlines not programmed by the second programming pulse (PPLS2) the corresponding bitlines so as to deactivate the bitlines. Likewise, for a section 'd2' of the programming sequence shown in FIG. 9, including a narrower section 'd1' in which the first programming pulse (PPLS1) is activated, the bitlines may be deactivated by applying the inhibit voltage Vdd to the bitlines when the bit values to be programmed are 01 and 00.

Referring back to FIG. 8, the first programming pulse (PPLS1) and the second programming pulse (PPLS2) may be successively applied. At this point, a time interval between an application of the first programming pulse (PPLS1) and an application of the second programming pulse (PPLS2) may be small enough not to cause the coupling effect due to the programming sequence as shown in FIGS. 6A through 6C.

Although FIGS. 8 through 10 show that an exemplary method of programming a non-volatile memory device according to an embodiment of the invention includes two programming pulses and one of the programming pulses performs programming operations corresponding to two bit values simultaneously, the present invention is not limited thereto. However, the voltage difference Vd related to cases in which the bit values to be programmed to a multi-level cell flash memory device (i.e. 00, 01, 10, and 11) is merely 1.4V as shown in FIG. 10, and thus it may be difficult to secure sufficient margin when the bitline voltages are set differently for each of the bit values within a range between 0V and Vdd.

If sufficient margin may be obtained, more than two bit values may be programmed by a single programming pulse. Thus, the present invention subsumes embodiments capable of programming with a single programming pulse.

Although FIGS. 8 through 10 show a method programming two bits to a multi-level cell flash memory device, the present invention is not limited thereto. In other words, the method of the present invention may be applied to multi-level cell flash memory devices having three or more bits.

Figure 11:
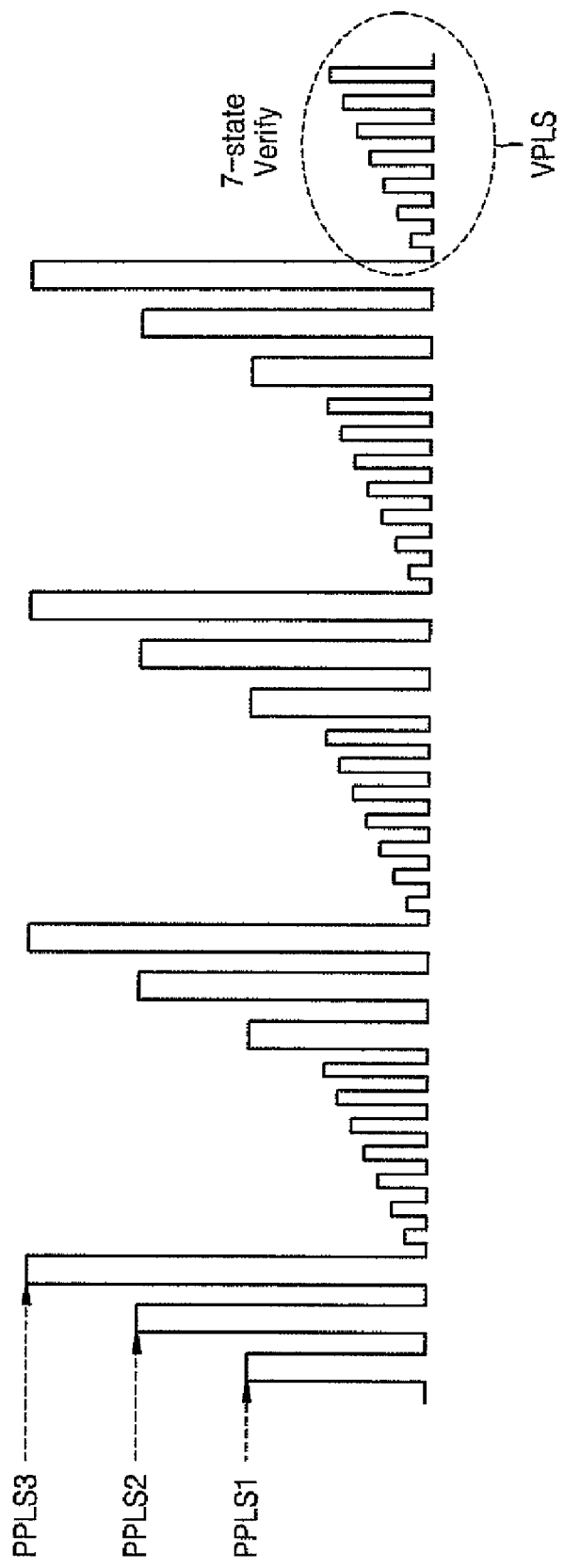
FIGS. 11 through 13 are diagrams showing a method of programming a three bit multi-level cell non-volatile memory device that prevents the coupling effect due to a programming sequence according to an embodiment of the invention.
Figure 12:
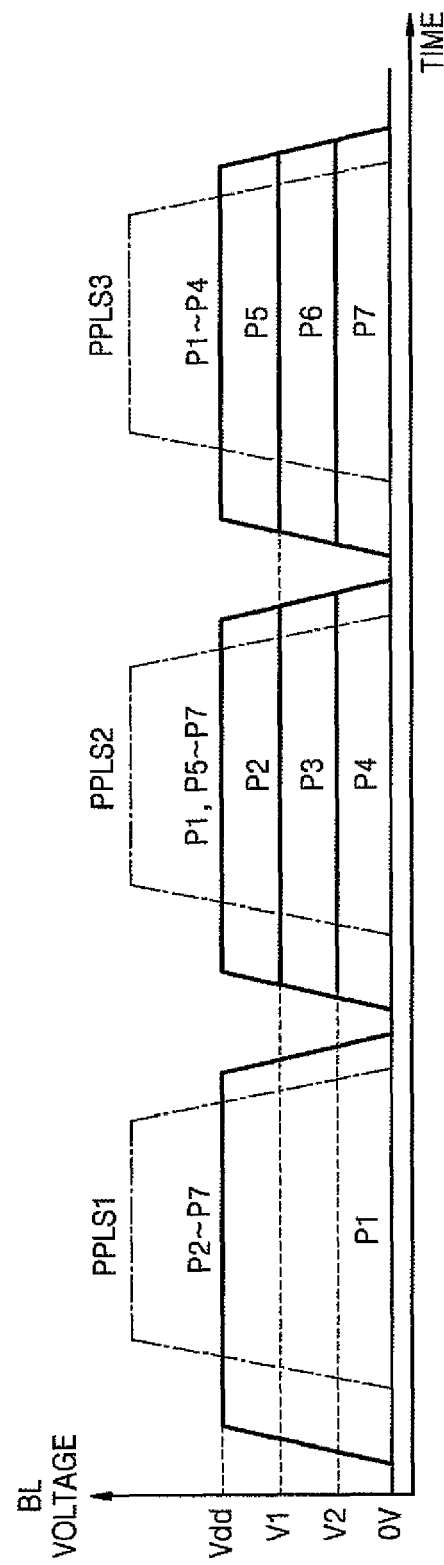
Figure 13:
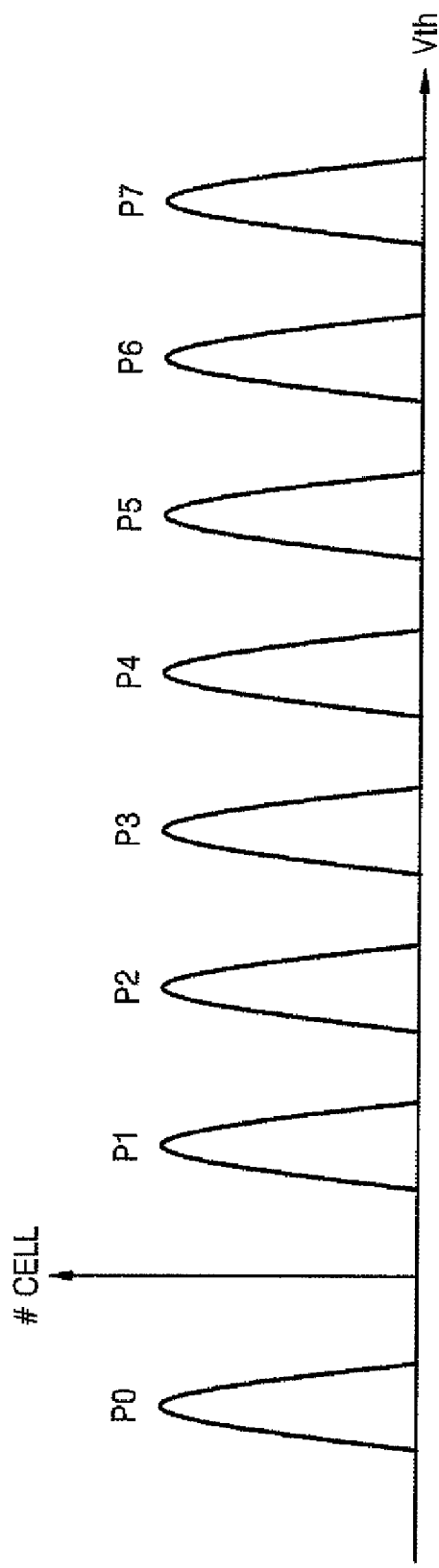

FIGS. 11 through 13 are diagrams showing a method of programming three bits to a multi-level cell non-volatile memory device which is capable of preventing the capacitive coupling effects due to programming sequence according to another embodiment of the invention.

Referring to FIGS. 11 through 13, the method of programming the three bits multi-level flash memory device may program eight memory cell states associated with the three bits of data to a multi-level flash memory device in response to three program pulses such that the resistances of the programmed memory cells change. At this point, critical voltage distributions for the programmed memory cells are shown in FIG. 13, numbered from P0 through P7.

More particularly, a first programming pulse (PPLS1) is applied to a corresponding wordline of the non-volatile memory device, a second programming pulse (PPLS2) having a different voltage from that of the first programming pulse (PPLS1) is applied to the wordline, and a third programming pulse (PPLS3) having a different voltage from those of the first programming pulse (PPLS1) and the second programming pulse (PPLS2) is applied to the wordline. In like manner to the method of programming the two bits multi-level cell flash memory device, the first through third programming pulse (PPLS1 through PPLS3) can be activated successively.

Thus, the first programming operation P1 may be performed in response to the first programming pulse (PPLS1), the second programming operation P2 may be performed in response to the second programming pulse (PPLS2), and the third programming operation P3 may be performed in response to the third programming pulse (PPLS3).

At this point, programming operations simultaneously performed by a single programming pulse can program differently by applying different bitline voltages. For example, when the second and fourth programming operations P2 and P4 are simultaneously performed by the second programming pulse (PPLS2), bitline voltages different from each other, such as 0V, V1, and V2, may be applied to bitlines connected to memory cells corresponding to each of the second and fourth programming operations P2 and P4.

Also, the inhibit voltage Vdd may be applied to bitlines of memory cells corresponding to second through seventh programming operations P2 through P7 deactivated at a section in which the first programming pulse (PPLS1) is activated. The inhibit voltage Vdd may be applied to bitlines of memory cells corresponding to the first programming operation P1 and the fifth through seventh programming operation P5 through P7 which are not activated by the second programming pulse (PPLS2). Likewise, the inhibit voltage Vdd may be applied to bitlines of memory cells corresponding to first through fourth programming operations P1 through P4 which are deactivated in a section in which the third programming pulse (PPLS3) is activated.

Accordingly, a coupling effect due to a programming sequence can be prevented in multi-level cell flash memory devices having three or more bits.

Referring back to FIG. 8, a verifying operation verifying whether the programming operations are accurately performed by the first programming pulse (PPLS1) and the second programming pulse (PPLS2) may be performed. At this point, the verifying operations regarding to different bit values can be separately performed whereas the programming operations regarding to different bit values are performed simultaneously by the first programming pulse (PPLS1) and the second programming pulse (PPLS2), in the methods of programming according to embodiments of the present invention.

For example, if the method of programming according to the present invention employs an incremental step pulse programming (ISPP), FIG. 8 shows a method of programming according to an embodiment of the present invention, in which three verification pulses VPLS, which indicate verifying operations regarding to the bit values 01, 11, and 10 shown in FIG. 6A, are activated between successive applications of the pair of the first programming pulse (PPLS1) and the second programming pulse (PPLS2).

At this point, verifying voltages applied to bitlines corresponding to bit values can have different magnitudes. However, the present invention is not limited thereto, and a plurality of bit values can be verified in a single verifying operation.

Figure 14:
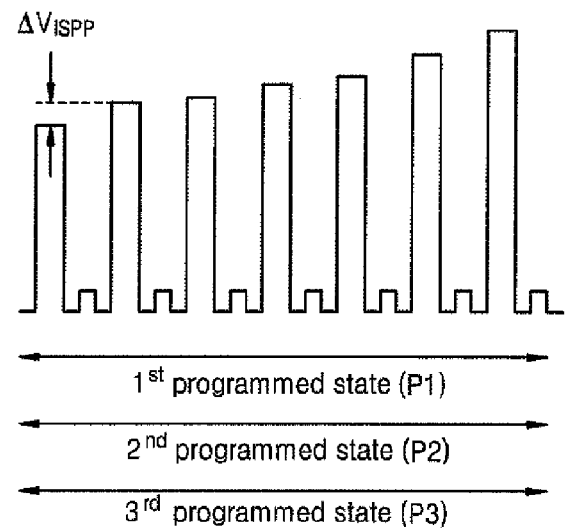
FIG. 14 is a diagram showing a plurality of programming operations simultaneously performed according to the method of FIG. 8.

Accordingly, in the methods of programming a non-volatile memory device according to embodiments of the invention, the first through third programming operations P1 through P3 regarding to a plurality of bit values are completed simultaneously or substantially simultaneously as shown in FIG. 14. Thus, any capacitive coupling effect influencing the programmed memory cells may be prevented, as shown in FIG. 6C.

Figure 15:
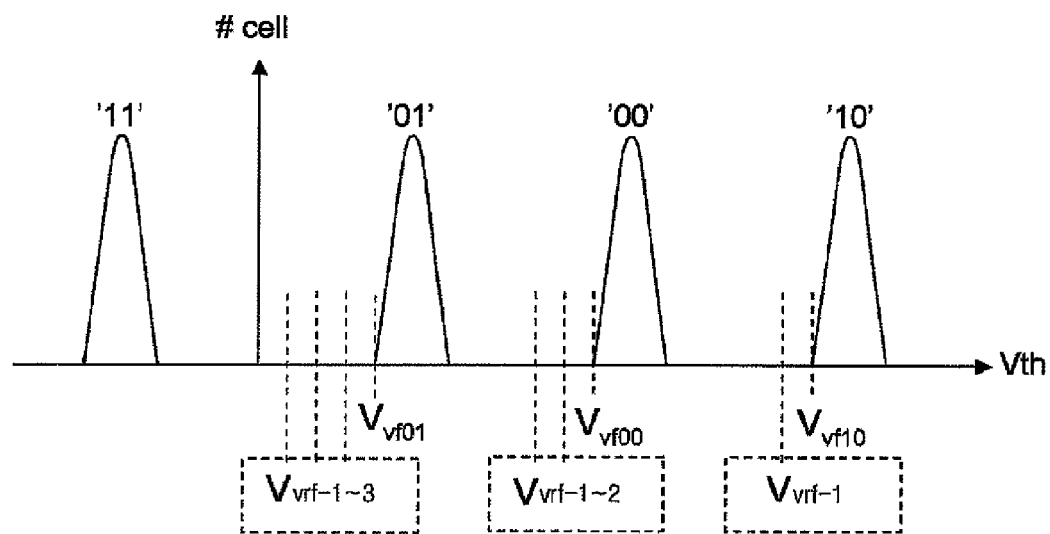
FIG. 15 is a diagram showing a method of programming a non-volatile memory device that prevents the coupling effect due to a cell distribution according to an embodiment of the invention.

FIG. 15 is a diagram showing a method of programming a non-volatile memory device according to an embodiment of the invention which his capable of preventing the capacitive coupling effects due to a cell distribution.

Referring to FIG. 15, the method of programming the non-volatile memory device according to the illustrated embodiment applies a programming pulse regarding to a plurality of bit values 00, 01, and 10, but a verification time of the programmed bit values are different from each other. The verification time for each of the programmed bit values may involve applying a different number of verifying voltages to corresponding bitlines of the non-volatile memory device. At this point, voltages applied to the corresponding bitlines by the method of programming shown in FIG. 15 may be different each time of application. For example, FIG. 15 shows that a verification regarding to the bit value 01 is performed by three different voltages Vvrf-1 through Vvrf-3, a verification regarding to the bit value 00 is performed by two different voltages Vvrf-1 and Vvrf-2, and a verification regarding to the bit value 10 is performed by a voltage Vvrf-1.

Figure 16:
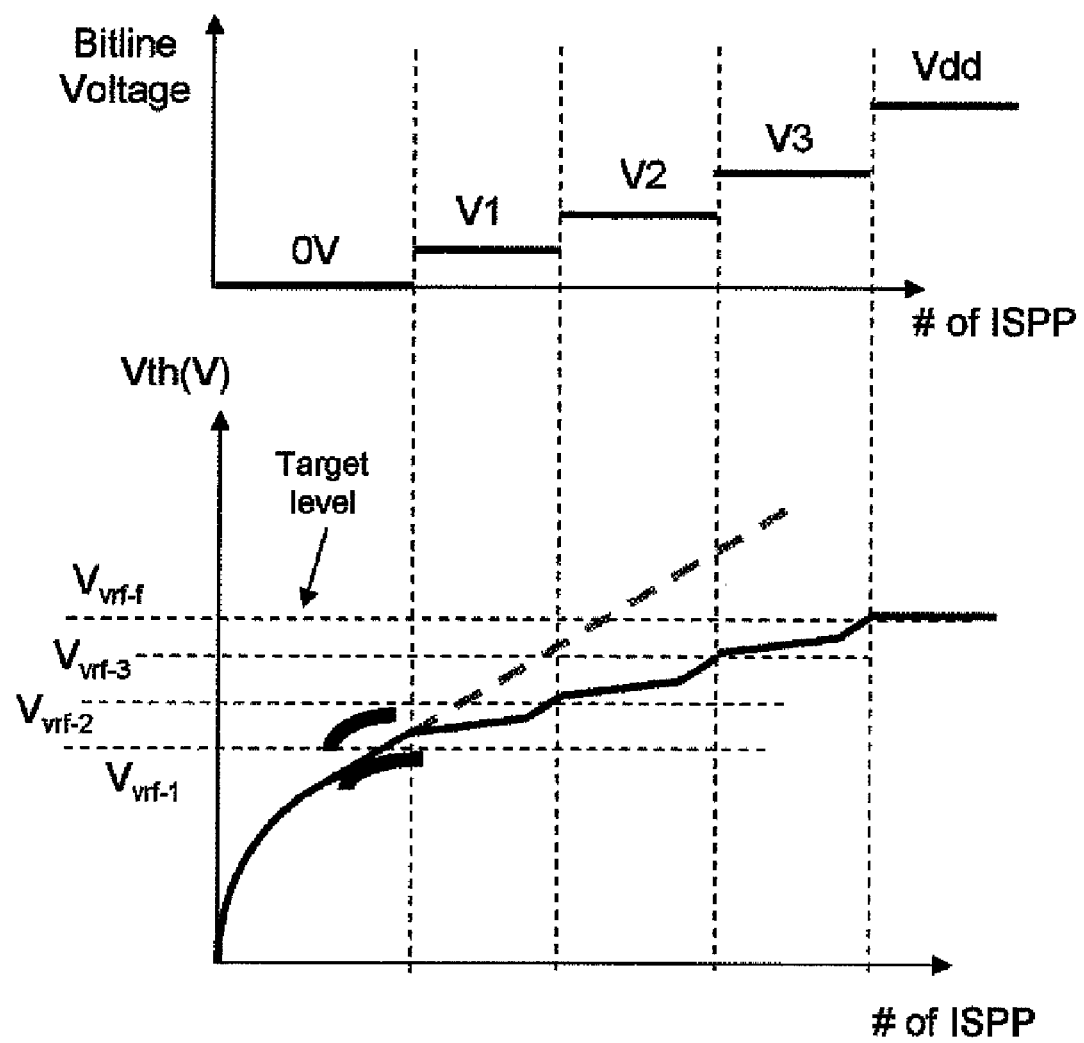
FIG. 16 is a diagram showing a verifying voltage applied to a bitline during the method of FIG. 15.

The voltage levels of the verifying voltages Vvrf-1 through Vvrf-3 may be the same as what is shown in FIG. 16. FIG. 17 shows the magnitudes of bitline voltages by comparing the magnitudes of the threshold voltages Vth and the verifying voltages Vvrf-1 through Vvrf-3 of a memory cell, regarding to the bit values.

Although FIGS. 15 through 17 are referred to describe the methods in a two bits multi-level cell flash memory device, the present invention is not limited thereto. Accordingly, the capacitive coupling effects due to a cell distribution may be reduced by having verification times that differ according to bit values, in a method of programming according to an embodiment of the invention.

FIG. 18 shows programmed states for a non-volatile memory device programmed according to a method embodiment of the present invention. Referring to FIG. 18, programming operations P1 through P3 and/or programming operation according to cell distributions FC, TC, and SC are respectively accomplished at time points t1 though t3, that is, almost simultaneously. Therefore, a random change of a critical voltage distribution due to the capacitive coupling effects due to programming sequence and/or cell distribution shown in FIGS. 6C and 7C may be prevented.

While the present invention has been particularly shown and described with reference to exemplary embodiments thereof, it will be understood by one of ordinary skill in the art that various changes in form and details may be made therein without departing from the scope of the present invention as defined by the following claims.

What is claimed is:

1. A method of programming memory cells of a multi-level cell non-volatile memory to one of a plurality of data values, the method comprising:

applying a first programming pulse to a wordline of the non-volatile memory device and a first bitline voltage to at least one first bitline associated with the wordline corresponding to a first data value among a plurality of data values;

applying a second programming pulse to the wordline, a second bitline voltage to at least one second bitline associated with the wordline corresponding to a second data value among the plurality of data values, and a third bitline voltage to at least one third bitline associated with the wordline corresponding to a third data value among the plurality of data values, wherein a voltage level of the second programming pulse is different from a level of the first programming pulse, the second bitline voltage is different from the third bitline voltage if the second data value and third data value are different, the second bitline voltage is applied to the at least one second bitline and the third bitline voltage is applied to the at least one third bitline simultaneously, the second programming pulse is applied to the wordline successively after the first programming pulse, and after applying the second programming pulse, applying at least one of a sequence of verifying voltages to the wordline successively, wherein a level of the at least one of the sequence of verifying voltages varies in accordance with a data value being programmed to the memory cell.

2. The method of claim 1, wherein respective levels of the verifying voltages in the sequence of verifying voltages sequentially increase, as applied during the verifying operation.

3. The method of claim 1, wherein each one of the respective levels of the verifying voltages in the sequence of verifying voltages is less than levels of the first programming pulse and the second programming pulse.

4. The method of claim 1, wherein the method of programming the multi-level cell non-volatile memory device is an iterative method comprising multiple programming loops, wherein each programming loop comprises:

applying the first programming pulse to the wordline and the first bitline voltage to the at least one first bitline, and then applying the second programming pulse to the wordline and the second bitline voltage to the at least one second bitline and the third bitline voltage to the at least one third bitline, and then applying the at least one of the sequence of verifying voltages to the wordline.

5. The method of claim 4, wherein the level of the first programming pulse and the level of the second programming pulse respectively increase with each successive iteration of the programming loop.

6. The method of claim 1, wherein the level of the first programming pulse is less than the level of the second programming pulse.

7. A method of programming memory cells of a multi-level cell non-volatile memory, the method comprising:

applying a first programming pulse to a wordline of the non-volatile memory device and a first bitline voltage to at least one first bitline associated with the wordline corresponding to a first latch value;

applying a second programming pulse to the wordline, a second bitline voltage to at least one second bitline associated with the wordline corresponding to a second latch value, and a third bitline voltage to at least one third bitline associated with the wordline corresponding to a third latch value, wherein a voltage level of the second programming pulse is different from a level of the first programming pulse, the second bitline voltage is different from the third bitline voltage if the second latch value and third latch value are different, the second bitline voltage is applied to the at least one second bitline and the third bitline voltage is applied to the at least one third bitline simultaneously, the second programming pulse is applied to the wordline successively after the first programming pulse, after applying the second programming pulse, applying at least one of a sequence of verifying voltages to the wordline successively, wherein a level of the at least one of the sequence of verifying voltages varies in accordance with a data value being programmed to the memory cell, and the first latch value, the second latch value and the third latch value are a value stored in at least one latch among a plurality of latches of a page buffer of the memory.

8. The method of claim 7, wherein the second bitline voltage is higher than the third bitline voltage and lower than a inhibit bitline voltage.

9. The method of claim 7, wherein the plurality of latches temporarily store the data being programmed into the memory cells as one of the first latch value, the second latch value and the third latch value.

10. A method of programming a non-volatile memory device comprising a first memory cell connected to a wordline and a first bitline and a second memory cell connected to the wordline and a second bitline, wherein the first memory cell and second memory cell are multi-level non-volatile memory cells capable of being programmed to $1^{st}$ through $M^{th}$ data values, the method comprising:

performing a programming operation during which the first memory cell is programmed to an $i^{th}$ data value among the $1^{st}$ through $M^{th}$ data values using a first programming pulse applied to the wordline, and the second memory cell is programmed to a $j^{th}$ data value among the $1^{st}$ through $M^{th}$ data values using a second programming pulse different from the first programming pulse and applied to the wordline, the programming operation comprising:

simultaneously applying a first bitline voltage having a first level and corresponding to the $i^{th}$ data value to the first bitline, and a second bitline voltage having a second level different from the first level and corresponding to the $j^{th}$ data value to the second bitline; and performing a verifying operation on the first memory cell and second memory cell, wherein execution timing for the verifying operation varies in relation to the $1^{st}$ through $M^{th}$ data values, the second programming pulse is applied to the wordline successively after the first programming pulse, and the verifying operation is performed after applying the second programming pulse, applying at least one of a sequence of verifying voltages to the wordline successively, wherein a level of the at least one of the sequence of verifying voltages varies in accordance with a data value being programmed to the memory cell.

11. The method of claim 10, wherein the verifying operation comprises:

applying at least one of a sequence of verifying voltages to the wordlines, wherein respective levels of the sequence of verifying voltages vary in accordance with a corresponding one of the $1^{st}$ through $M^{th}$ data values.

12. The method of claim 10, wherein the programming operation programs the $i^{th}$ data value before programming the $j^{th}$ data value, and the verifying operation comprises applying up to a first number of verifying voltages to verify the programming of the $i^{th}$ data value and applying up to a second number of verifying voltages to verify the programming of the $j^{th}$ data value, wherein the first number is greater than the second number.

13. The method of claim 12, wherein applying up to the first number of verifying voltages requires up to a first execution time, and applying up to the second number of verifying voltages requires up to a second execution time, wherein the first execution time is greater than the second execution time.

14. A method of programming memory cells of a multi-level cell non-volatile memory to one of a plurality of data values, the method comprising:

applying a first programming pulse to a wordline of the non-volatile memory device, a first bitline voltage to at least one first bitline associated with the wordline corresponding to a first data value among a plurality of data values, a second bitline voltage to at least one second bitline associated with the wordline corresponding to a second data value among the plurality of data values;

applying a second programming pulse to the wordline, a third bitline voltage to at least one third bitline associated with the wordline corresponding to a third data value among the plurality of data values, wherein a voltage level of the second programming pulse is different from a level of the first programming pulse, the first bitline voltage is different from the second bitline voltage if the first data value and second data value are different, the first bitline voltage is applied to the at least one first bitline and the second bitline voltage is applied to the at least one second bitline simultaneously, the second programming pulse is applied to the wordline successively after the first programming pulse, and after applying the second programming pulse, applying at least one of a sequence of verifying voltages to the wordline, wherein a level of the at least one of the sequence of verifying voltages varies in accordance with a data value being programmed to the memory cell.

15. The method of claim 14, wherein the level of the first programming pulse is less than the level of the second programming pulse.

* * * * *